April 17, 1962 R. P. MILLER 3,030,524

BALANCED TRANSISTOR SWITCHING CIRCUITS

Filed Dec. 17, 1958

INVENTOR
R. P. MILLER
BY Kenneth B. Hamlin
ATTORNEY

United States Patent Office 3,030,524
Patented Apr. 17, 1962

3,030,524

BALANCED TRANSISTOR SWITCHING CIRCUITS

Ralph P. Miller, Bound Brook, N.J., assignor to Bell Telephone Laboratories, Incorporated, New York, N.Y., a corporation of New York Filed Dec. 17, 1958, Ser. No. 781,077
7 Claims. (Cl. 307—88.5)

Figure 1:
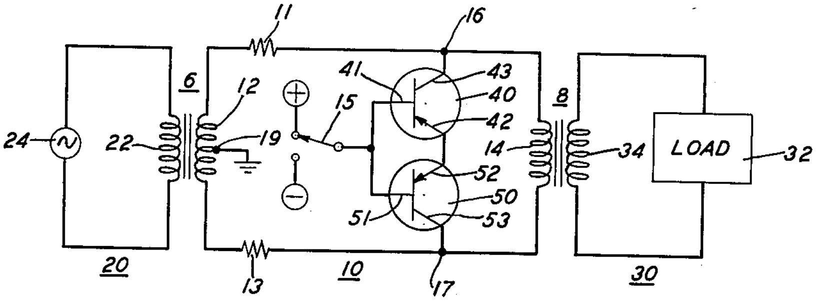

This invention relates in general to electrical circuits and, more particularly, to electronic switching circuits employing semiconductor devices.

With the advent of high-speed electrical systems, the need has arisen for electronic control or switching circuits capable of exhibiting very fast response times. High-speed switching circuits find many applications in such areas as high-speed data processing systems. It is, accordingly, a general object of this invention to improve high-speed electrical switching circuits.

Often it is a requirement of the system that the voltages being switched be very high. This has either eliminated the possible use of transistor switches or has necessitated the use of both step-down and step-up transformers. One such known switching circuit utilizes two transistors serially connected between an input and an output transformer. The emitter electrodes of the two transistors are connected one at either end of the low potential winding of the input transformer; and the collector electrodes are connected one at either end of the low potential winding of the load transformer. The base electrodes of the transistors are connected in common selectively to positive or negative direct voltage to switch input power to and from the load by closing and opening the circuit, similar to the action of a simple toggle switch. Since the transistors are serially connected between the input and output circuits, any power transferred to the output circuit must pass through the transistors.

When the switching action is one of opening and closing an electrical circuit, as it is in this and other known switching circuits, the use of load transformer coupling introduces the problem of high-speed transients. The transient surge created by open circuiting the input to the load transformer is usually undesirable and may adversely affect the operation of the system. An example would be a system wherein such high-speed transients might cause damage by arcing within the system.

Accordingly, another object of this invention is to provide a high-speed switching circuit which will minimize undesirable high-speed transients.

Still another object of this invention is to make possible very rapid switching of high voltages.

In its principal aspect, the present invention comprises a balanced electronic switch employing two transistors connected back-to-back; that is, their emitter and base electrodes are directly interconnected. Connected in this manner, the two transistors act as a single bilateral transistor. The interconnected emitter electrodes are left floating, thus eliminating the problem of Zener voltage breakdown. In addition, the transistors connected in this manner allow nearly twice the peak-to-peak alternating voltage signal swing allowed by one of the individual transistors.

The two transistors are connected, via their collector electrodes, across an impedance load. The load is supplied by a source of high voltage, alternating-current power through a step-down input transformer connected to the load. If high voltage is desired at the load, a step-up load transformer may be advantageously connected between the input transformer and the load, with the two back-to-back transistors bridged across the low potential winding of the load transformer.

The transistors are selectively rendered conducting and not conducting through the respective application of opposite polarities of direct voltage to the base electrodes. When the transistors are switched to the conducting state, they effectively shunt the load with a short circuit, thus rapidly removing the power from the load. This power then may be advantageously dissipated through suitable resistance placed in the circuit between the input transformer and the load; or, the power may be advantageously switched through a second input transformer and a similar two-transistor switch to another impedance load. Similarly, when the transistors are switched to the not-conducting state, the input power is wholly applied to the impedance load.

Accordingly, it is a feature of my invention that a switching circuit for switching input power to and from an impedance load includes two back-to-back transistors connected across the impedance load, a source of positive and negative pulses for selectively changing the impedance state of the transistors, and circuitry for receiving the input power when the transistors are in the low impedance state.

It is a further feature of my invention that load impedance circuits are selectively switched "on" and "off" by shunting the circuits with very high and very low impedances.

Figure 2:
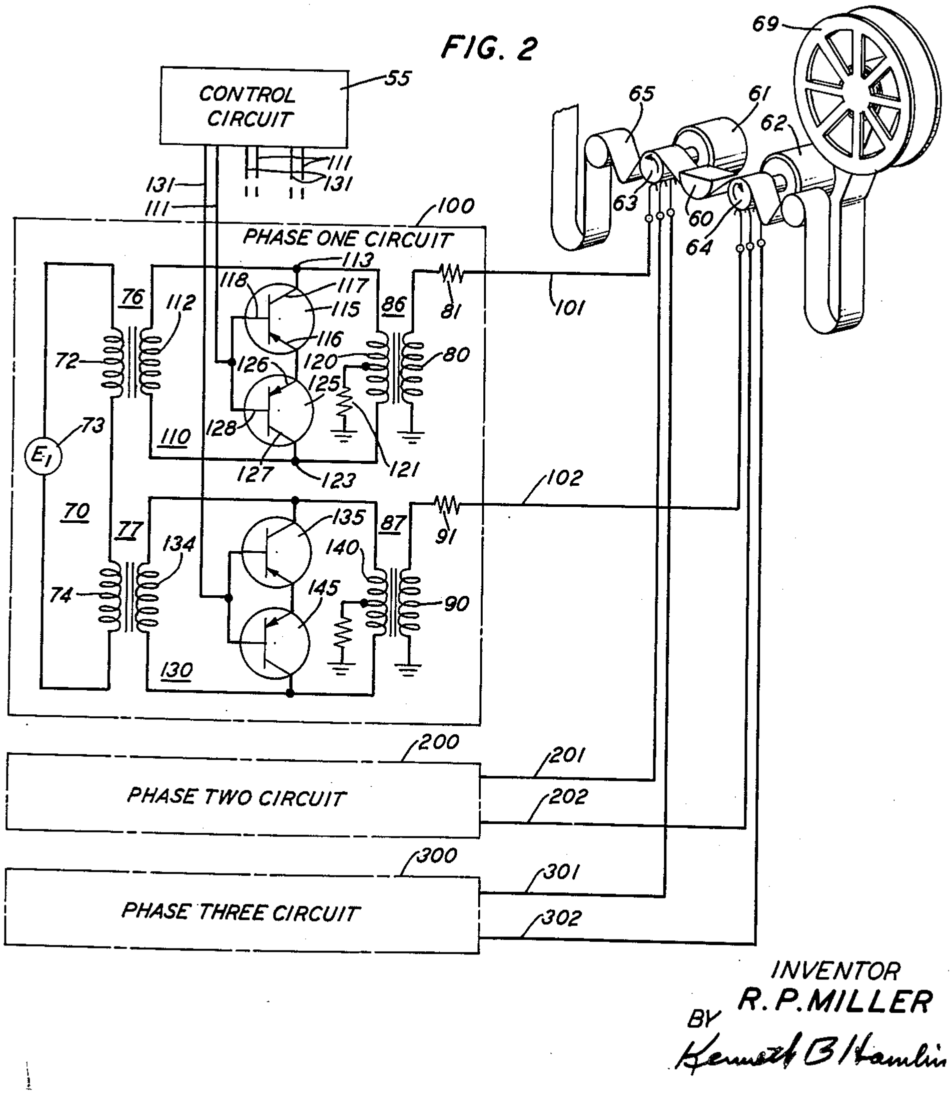

These and other objects and features of this invention will be better understood upon consideration of the following detailed description and the accompanying drawing, in which:

FIG. 1 is an illustrative embodiment employing the principles of the invention; and FIG. 2 is an alternative illustrative embodiment of the invention.

Referring now to FIG. 1 of the drawing, a basic illustrative embodiment is shown consisting of a balanced switching circuit 10, a source circuit 20, and a load circuit 30. The source circuit 20 consists quite simply of a source 24 of high voltage, alternating-current power connected to the high potential winding 22 of input transformer 6. The input transformer 6 is employed to step down the high voltage from source 24 to a voltage level that may be suitably handled by the switching circuit 10.

The load circuit 30 consists of an impedance load 32 connected to the high potential winding 34 of load transformer 8. The load transformer 8 is employed to step up the voltage to the desired load voltage level.

Considering the switching circuit 10, the path for transmitting alternating-current power from input source 24 to load 32 may be traced through input transformer 6, resistors 11 and 13, and load transformer 8. Bridged across the low potential winding 14 of load transformer 8 is a pair of transistors 40 and 50 connected back-to-back between connection points 16 and 17. The emitters 42 and 52 of transistors 40 and 50, respectively, are directly interconnected. Similarly, the bases 41 and 51 of transistors 40 and 50, respectively, are directly interconnected. The collector 43 of transistor 40 is connected to connection point 16, and the collector 53 of transistor 50 is connected to connection point 17.

The bases 41 and 51 of the transistors 40 and 50 are selectively connected, through the switch 15, to a source of positive direct voltage and to a source of negative direct voltage. It will be noted that low potential winding 12 of input transformer 6 has a center-tap terminal 19 connected to ground potential. Thus, the balanced direct-current paths may be traced from one of the sources of direct voltage through switch 15 to bases 41 and 51 of transistors 40 and 50. One-half of the path follows through collector 43 of transistor 40, through connection point 16, through resistor 11, and through the upper half of low potential winding 12 and center-tap terminal 19 to ground potential. The other half of the path similarly follows through collector 53 of transistor 50, connection point 17, resistor 13, and through the lower half of low potential winding 12 and center-tap terminal 19 to ground potential.

As is well known in the art, transistors can exhibit virtually zero impedance or a very high impedance depending upon the bias voltage. For example, considering a P-N-P transistor, a positive base bias voltage of sufficient magnitude switches the transistor into the high impedance state. Conversely, a negative base bias voltage switches the transistor into the low impedance state. Naturally, considering an N-P-N transistor, the polarity of the bias voltage to achieve a particular impedance state would be the reverse of that required for the P-N-P transistor.

Hence, the operation of switch 15 between the positive and negative sources of direct voltage switches the transmission of input alternating-current power "on" and "off" with respect to load 32. For purposes of illustration, assuming the use of P-N-P transistors 40 and 50 as shown in FIG. 1, the operation of switching circuit 10 will be considered with switch 15 making connection with the source of positive direct voltage. The positive direct voltage source will bias transistors 40 and 50 in the reverse direction. Consequently, transistors 40 and 50 exhibit their high impedance state, appearing as an open circuit to source 24. Therefore, the input alternating-current power from source 24 is transmitted through input transformer 6, resistors 11 and 13, and load transformer 8 to load 32. The only power losses of any consequence are in resistors 11 and 13. Accordingly it is seen that switch 15 placed in the positive direct voltage source connection turns the circuit "on."

The circuit may be turned "off" with respect to the load by operating switch 15 to make connection with the source of negative direct voltage. The transistors thus are biased in the forward direction; that is, they exhibit their low impedance state. The circuit between connection points 16 and 17 through transistors 40 and 50 becomes essentially a short circuit, shunting the low potential winding 14 of a load transformer 8. As a result, the alternating-current power is removed from load transformer 8, and therefore from load 32, very rapidly. When the circuit 10 is in the "off" condition, the alternating-current path may be traced through resistors 11 and 13 and through transistors 40 and 50. Therefore, when the circuit 10 is in the "off" condition, the alternating-current power is principally dissipated in resistors 11 and 13.

The embodiment described above clearly shows the principles of the invention. The power is switched from the load by shunting the load with a very low impedance; and the power is switched to the load by shunting the load with a very high impedance. The time required for switching the power "off" and "on" with respect to the load is principally determined by the characteristics of the load transformer. The speed with which the power is transmitted to the load depends upon the rise time of the transformer. To achieve a sharp rise, the leakage inductance and winding capacitance of the transformer must be minimized. However, if the rise time is made too abrupt, the output voltage of the load transformer may overshoot the desired output, and oscillation may be encountered.

Similarly, the speed with which the power may be removed from the load depends principally on the decay time of the load transformer. The lower the secondary winding capacitance, the faster the rate of decay. As was specifically mentioned hereinbefore, the power is removed from the load by short-circuiting the primary winding of the load transformer rather than open-circuiting the load transformer. This results in the advantageous elimination of undesirable high-speed transients.

A second embodiment of my invention in accordance with the principles described above is shown in FIG. 2 of the drawing. The particular application shown is in connection with electrostatic clutches in information bearing tape drive systems. An electrostatic clutch in such a system comprises a capstan and the information bearing tape, each responsive to electrostatic forces. The electrostatic clutch operates on the principle of the attraction of two plates of an electrically charged condenser. The capstan consists of a conductive member and acts as one of the plates, and a conductive member in the tape acts as the other plate. The two plates are separated by a dielectric bonded either to the surface of the capstan or to the surface of the tape facing the capstan, or to both. The conductive member in the tape is advantageously at ground potential and the electrostatic forces are generated upon application of alternating voltage to the conductive member in the capstan, thereby attracting the tape to the capstan.

In the particular application shown in FIG. 2, it is desired to switch high voltages very rapidly from one clutch to the other in order to start and stop the information bearing tape. In the upper right-hand corner of FIG. 2, part of such a tape drive system is shown. The storage reel 69 and a second storage reel not shown are used to store tape 65, and they are driven by separate motors not shown. Both of the reels rotate in either direction to take up tape 65 or to let it out. Similarly, capstan motors 61 and 62 drive capstans 63 and 64, except that capstans 63 and 64 rotate only in the directions indicated by the arrows, the one capstan for driving tape 65 in the forward direction and the other for driving it in the reverse direction. The sensing element 60 is used for reading in and reading out of information to and from tape 65.

The capstans 63 and 64 include three insulated conductive segments. The three segments of capstan 63 are connected through individual brushes, or some similar known arrangement, to lines 101, 201 and 301. In a like manner, the three segments of capstan 64 are connected to lines 102, 202 and 302. Lines 101, 201 and 301 apply three-phase, alternating-current power to the segments of capstan 63 when desired; and similarly, lines 102, 202 and 302 apply three-phase, alternating-current power to the segments of capstan 64. When voltage is applied to one of the capstans, electrostatic force generates a radial pressure on tape 65 drawing it toward the rotating capstan. Thus, the radial pressure on tape 65 times the coefficient of friction between the tape and the particular rotating capstan 63 or 64 accelerates tape 65 in the direction of rotation.

In normal operation of such a tape drive system, it is contemplated that while one capstan is rotating, driving the tape in that particular direction, the other capstan remains stationary. Thus, when it is desired to stop the tape, the high voltage, alternating-current power is removed from the driving capstan and applied to the stationary capstan. The electrostatic force generated at the stationary capstan therefore stops the moving tape very rapidly.

The voltage required to generate sufficient force for use in the application of the electrostatic clutch is quite high, on the order of one kilovolt peak or more. Additionally, for compatible operation with a high-speed data processing system, the drive system must be capable of starting, stopping and reversing the direction of the tape in a very short length of time. In most applications, the alternating voltage is supplied to the electrostatic clutch by a load transformer. Opening the circuit between the input voltage and the load transformer causes a transient surge which might arc between the tape and the capstan and thus damage the tape. Accordingly, the circuit shown in FIG. 2 in accordance with the principles of my invention may be used advantageously to switch very rapidly the desired high voltages without creating undesirable transients.

A phase circuit 100 is shown in detail for one phase of the three-phase, alternating-current power being supplied to capstans 63 and 64. The blocks labeled with the reference numerals 200 and 300 contain circuitry substantially identical to phase circuit 100. The phase circuits 200 and 300 are connected to the other two phases of the three-phase input power. Considering circuit 100, it includes two parallel switching circuits 110 and 130 and a single-phase, alternating-current supply circuit 70. Phase supply circuit 70 includes one-phase supply 73 of the three-phase input power and the primary windings 72 and 74 of two step-down input transformers 76 and 77, all serially connected.

The switching circuit 110 includes secondary winding 112 of input transformer 76, primary winding 120 of step-up load transformer 86 and two transistors 115 and 125. The input secondary winding 112 and the load primary winding 120 are serially connected through connection points 113 and 123. Bridged across load primary winding 120 between connections 113 and 123 are two transistors 115 and 125, connected back-to-back in a manner substantially the same as transistors 40 and 50 of the embodiment of FIG. 1. The emitters 116 and 126, and the bases 118 and 128 of transistors 115 and 125, respectively, are directly interconnected. The collector 117 is connected to connection point 113 and the collector 127 is connected to connection point 123. Connected to bases 118 and 128 through lead 111 is a control circuit 55 for selectively applying positive and negative control pulses to the switching circuits. A current limiting resistor 121 is connected between ground potential and a center-tap terminal of primary winding 120 of load transformer 86.

In a similar manner, switching circuit 130 includes secondary winding 134 of input transformer 77, primary winding 140 of load transformer 87, and two transistors 135 and 145 connected back-to-back as hereinbefore described.

The secondary windings 80 and 90 of load transformers 86 and 87 are connected between ground potential and one segment of capstans 63 and 64 through resistors 81 and 91 and leads 101 and 102. The resistors 81 and 91 serve to damp any oscillations in the output circuit.

In substantially the same manner, the remaining two segments of capstans 63 and 64 are connected through leads 201 and 202 and through leads 301 and 302 to load transformers in circuits 200 and 300.

Considering control circuit 55, the leads 111 are connected to the individual switching circuits in circuits 100, 200 and 300 which are connected to capstan 63 through leads 101, 201 and 301. The leads 131 are connected to the individual switching circuits connected to capstan 64. Therefore, a voltage pulse of one polarity on lead 111 and of the opposite polarity on lead 131 would enable one of capstans 63 or 64 as a clutch and disable the other one. For this purpose, the control circuit 55 may be advantageously a bistable circuit such as a multivibrator.

Assuming the use of P-N-P transistors, by way of example, and considering the operation of only one phase of the circuit, the method of enabling capstan 63 will be discussed. Control circuit 55 applies a positive direct voltage through one of leads 111 to bases 118 and 128 of transistors 115 and 125. The transistors 115 and 125 are thus caused to exhibit their high impedance state, allowing alternating-current power applied to input transformer 76 to be transmitted through connection points 113 and 123 to load transformer 86 and capstan 63. This enables capstan 63 to act as a clutch and drive tape 65 in the direction indicated by the arrow on capstan 63.

Concurrently, a negative direct voltage is applied through one of leads 131 to bases 138 and 148 of transistors 135 and 145. The transistors 135 and 145 are therefore biased to exhibit their low impedance state. Thus, an essentially short circuit is connected across input secondary winding 134 and load primary winding 140. The alternating-current power is removed very rapidly from capstan 64 and it is disabled as a clutch.

To stop the direction of drive to tape 65, control circuit 55 reverses the polarity of the direct voltage applied on leads 111 and 131. Thus, switching circuit 110 is turned "off" with respect to rotating capstan 63 and switching circuit 130 is turned "on" with respect to stationary capstan 64. Capstan 63 is disabled and capstan 64 is enabled as a clutch, stopping tape 65.

In the embodiment of FIG. 2 there are virtually no power losses. When switching circuit 110 is switched "off" with respect to its associated load, the secondary winding 112 of input transformer 76 is essentially shunted by a short circuit. Therefore, since switching circuit 130 is concurrently switched "on" with respect to its associated load, all of the input power from source 73 is applied through input transformer 77 to load transformer 87 and capstan 64. This results in the advantageous elimination of the resistance in the alternating-current path, which is shown in the circuit of FIG. 1 for dissipating the input power when the circuit is turned "off."

It is understood that the above-described arrangements are merely illustrative of the application of the principles of the invention. Numerous other arrangements may be devised by those skilled in the art without departing from the spirit and scope of the invention.

What is claimed is:

1. A switching circuit comprising a first and a second conductor, an impedance load connected to said first and second conductor, a first and a second transistor each including an emitter, a collector and a base, said collector of said first transistor connected to said first conductor, said collector of said second transistor connected to said second conductor, means directly interconnecting said emitters of said transistors, controlling means connected to said bases of said transistors for selectively switching the impedance state of said transistors, a source of input voltage connected to said first and second conductor, and means for receiving power from said source when said transistors are switched to a low impedance state.

2. A switching circuit in accordance with claim 1 wherein said source of input voltage includes a source of high voltage and a transformer having primary and secondary windings, said secondary winding having a center-tap terminal at ground potential, and wherein said means for receiving power from said source when said transistors are switched to a low impedance state includes a first and a second resistance serially connected between said source of input voltage and said collectors of said transistors.

3. A switching circuit in accordance with claim 1 wherein said impedance load includes a transformer having a primary and a secondary winding and an impedance connected to said secondary winding, said primary winding having a center-tap terminal at ground potential, and wherein said means for receiving power includes a second load switching circuit comprising a second pair of conductors, a second pair of transistors each having an emitter, a base and a collector, said emitters of said transistors being interconnected, said collectors of said transistors each connected respectively to one of said second pair of conductors, controlling means connected to said bases of said transistors, and balanced impedance means connected to said second pair of conductors.

4. A switching circuit comprising a first and a second input transformer each having a primary and a secondary winding, a source of input voltage, said primary windings serially connected to said source of input voltage, a first and a second transistor switch each including a pair of transistors having individual emitters, bases and collectors, said emitters of each pair of said transistors being individually interconnected and said bases of each pair of transistors being individually interconnected, said collectors of said first transistor switch being connected to said secondary winding of said first input transformer and said collectors of said second transistor switch being connected to said secondary winding of said second input transformer, a first and a second output transformer each including a primary winding having a center-tap terminal and a secondary winding, said center-tap terminal of said primary windings individually connected to ground potential, said primary windings of said first and second output transformers respectively connected to said secondary windings of said first and second input transformers, a first and a second impedance load, said first and second loads respectively connected to said secondary windings of said first and second output transformers, and control means connected to said bases of said transistor switches for selectively switching the impedance state of said transistors, said control means sending control pulses of opposite polarity simultaneously to said first and second transistor switches.

5. A switching circuit comprising a plurality of input transformers each having a primary and a secondary winding, a source of input voltage, said primary windings serially connected to said source of input voltage, a plurality of balanced impedance loads, said plurality of loads connected to respective ones of said secondary windings of said input transformers, a plurality of transistor switches each including a pair of transistors having individual emitter, base and collector electrodes, said emitter electrodes of each pair of transistors being individually interconnected and said base electrodes of each pair of transistors being individually interconnected, said collector electrodes of each pair of transistors being respectively connected to respective ones of said secondary windings of said plurality of input transformers, and control means connected to said bases for selectively switching the impedance state of particular ones of said transistor switches.

6. In combination, a first and a second transistor each having an emitter, a base and a collector, means directly interconnecting said emitters of said first and second transistors, a first and a second conductor, said collector of said first transistor and said collector of said second transistor respectively connected to said first and second conductors, a third and a fourth transistor each having an emitter, a base and a collector, means directly interconnecting said emitters of said third and fourth transistors, a third and a fourth conductor, said collector of said third transistor and said collector of said fourth transistor respectively connected to said third and fourth conductors, means for connecting an input circuit to said first and second and to said third and fourth conductors, a first and a second balanced impedance load, said first load connected to said first and second conductors and said second load connected to said third and fourth conductors, a first source of positive pulses, a second source of negative pulses, means for coupling pulses from one of said first or second source to said bases of said first and second transistors, and means for simultaneously coupling pulses from the other of said first and second pulse source to said bases of said third and fourth transistors.

7. A switching circuit comprising a plurality of electronic switches, each including a pair of transistors having individual emitter, base and collector electrodes, means directly interconnecting said emitters of each pair of transistors a plurality of balanced impedance loads connected in parallel with respective ones of said switches, an input circuit, transformer means for individually coupling said input circuit to each of said switches, and control circuit means for concurrently enabling the transistor pairs of particular ones of said switches to selectively couple signals from said input circuit to particular ones of said plurality of balanced impedance loads.

References Cited in the file of this patent

UNITED STATES PATENTS

| | | |
|---|---|---|
| 2,594,449 | Kircher | Apr. 29, 1952 |
| 2,816,238 | Elliott | Dec. 10, 1957 |
| 2,891,171 | Shockley | June 16, 1959 |
| 2,897,413 | Hodges | July 28, 1959 |
| 2,942,124 | Kistler | June 21, 1960 |
| 2,960,681 | Bonn | Nov. 15, 1960 |